(12) United States Patent
Krumbein et al.

(10) Patent No.: US 8,497,558 B2
(45) Date of Patent: Jul. 30, 2013

(54) SYSTEM AND METHOD FOR WAFER LEVEL PACKAGING

(75) Inventors: Ulrich Krumbein, Rosenheim (DE); Gerhard Lohninger, Munich (DE); Alfons Dehe, Reutlingen (DE)

(73) Assignee: Infineon Technologies AG, Neubiberg (DE)

( * ) Notice: Subject to any disclaimer, the term of this patent is extended or adjusted under 35 U.S.C. 154(b) by 2 days.

(21) Appl. No.: 13/183,272

(22) Filed: Jul. 14, 2011

(65) Prior Publication Data

US 2013/0015467 A1   Jan. 17, 2013

(51) Int. Cl.
*G01L 9/00* (2006.01)
*H01L 21/00* (2006.01)

(52) U.S. Cl.
USPC .................................. 257/419; 438/51

(58) Field of Classification Search
USPC ................................. 257/419; 438/51
See application file for complete search history.

(56) References Cited

U.S. PATENT DOCUMENTS

| | | | |
|---|---|---|---|
| 6,271,607 B1 | 8/2001 | Vandenbossche | |
| 6,635,509 B1* | 10/2003 | Ouellet | 438/106 |
| 8,151,640 B1* | 4/2012 | Kubena | 73/504.04 |
| 2004/0080044 A1 | 4/2004 | Moriyama et al. | |
| 2006/0113598 A1* | 6/2006 | Chen et al. | 257/347 |
| 2007/0134336 A1* | 6/2007 | Worle et al. | 424/489 |
| 2007/0275300 A1* | 11/2007 | Salot et al. | 429/163 |
| 2008/0190748 A1* | 8/2008 | Arthur et al. | 200/181 |
| 2010/0044853 A1* | 2/2010 | Dekker et al. | 257/692 |
| 2010/0096713 A1* | 4/2010 | Jung | 257/415 |
| 2012/0080701 A1* | 4/2012 | Kim et al. | 257/98 |

FOREIGN PATENT DOCUMENTS

EP    1 394 857 A2    3/2004

* cited by examiner

*Primary Examiner* — William D Coleman
(74) *Attorney, Agent, or Firm* — Slater & Matsil, L.L.P.

(57) ABSTRACT

In an embodiment, a semiconductor device includes a semiconductor substrate. The semiconductor substrate has a first cavity disposed through it, and conductive material covers at least the bottom portion of the first cavity. An integrated circuit is disposed on the top surface of the conductive material. The device further includes a cap disposed on the top surface of the substrate, such that a cavity disposed on a surface of the cap overlies the first cavity in the substrate.

31 Claims, 19 Drawing Sheets

SYSTEM AND METHOD FOR WAFER LEVEL PACKAGING

TECHNICAL FIELD

This invention relates generally to semiconductor packages, and more particularly to wafer level packaging.

BACKGROUND

Integrated circuit (ICs) chips are conventionally enclosed in packages that provide protection from environmental conditions and enable electrical interconnection between the semiconductor chips and other electrical components, such as a printed circuit board or a motherboard. In many cases, packaged semiconductors are produced by adhering an IC to a lead frame, attaching bond wires between IC pads and lead frame pins, and then surrounding the lead frame and the IC with an encapsulant, such as epoxy resin. In other cases, the encapsulant is omitted, and the IC and lead frame are covered with a ceramic lid, leaving the bond wires surrounded by air.

In particular, LDMOS power transistors are often packaged with bond wires surrounded by air to reduce parasitic coupling to the bond wires and maintain high Q levels. Such packages are produced, for example, by mounting an LDMOS power transistor die to a metallic substrate and/or lead frame, mounting passive components to provide matching, tuning and other functions. The IC and passive components are then covered with a ceramic composite lid, which is typically sealed tightly to protect the semiconductor devices from environmental factors. Packaging semiconductor devices in this manner, however, is costly, because each IC is separately and individually packaged.

For example, conventional power transistor package 1 is illustrated in FIG. 1. Transistor 7 and capacitors 5 are mounted on substrate 8. Package 1 contains metallic ground connection 2, radio frequency (RF) output and direct current (DC) input 3. Package 1 also contains RF input 4. Ceramic lid 6 is placed over substrate 8 and tightly sealed to complete the package for power transistor 1.

SUMMARY OF THE INVENTION

In an embodiment, a semiconductor device includes a semiconductor substrate. The semiconductor substrate has a first cavity disposed through it, and conductive material covers at least the bottom portion of the first cavity. An integrated circuit is disposed on the top surface of the conductive material. The device further includes a cap disposed on the top surface of the substrate, such that a cavity disposed on a surface of the cap overlies the first cavity in the substrate.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely wafer level packaging of LDMOS transistors. Embodiments of the invention may also be applied, however, to wafer level packaging of other ICs.

Embodiments involve providing a wafer on which passive components are fabricated. Recesses are etched in the wafer and lined with a conductive material. Integrated circuits, such as power transistor dice, are placed in the recesses on top of the conductive material. The integrated circuits are then bonded to the passive components by bond wires. Next, bond wires are attached to connect the passive components to input conductive material and to output conductive material. A cap is attached to the wafer over the integrated circuit and over the bond wires such that they are enclosed. Next, the bottom of the wafer is ground to expose the conductive material on the bottom of the wafer. Conductive pads are attached to the exposed bottom of the conductive material. After testing, the wafer is diced and finally assembled in a tape and reel.

Figure 1:
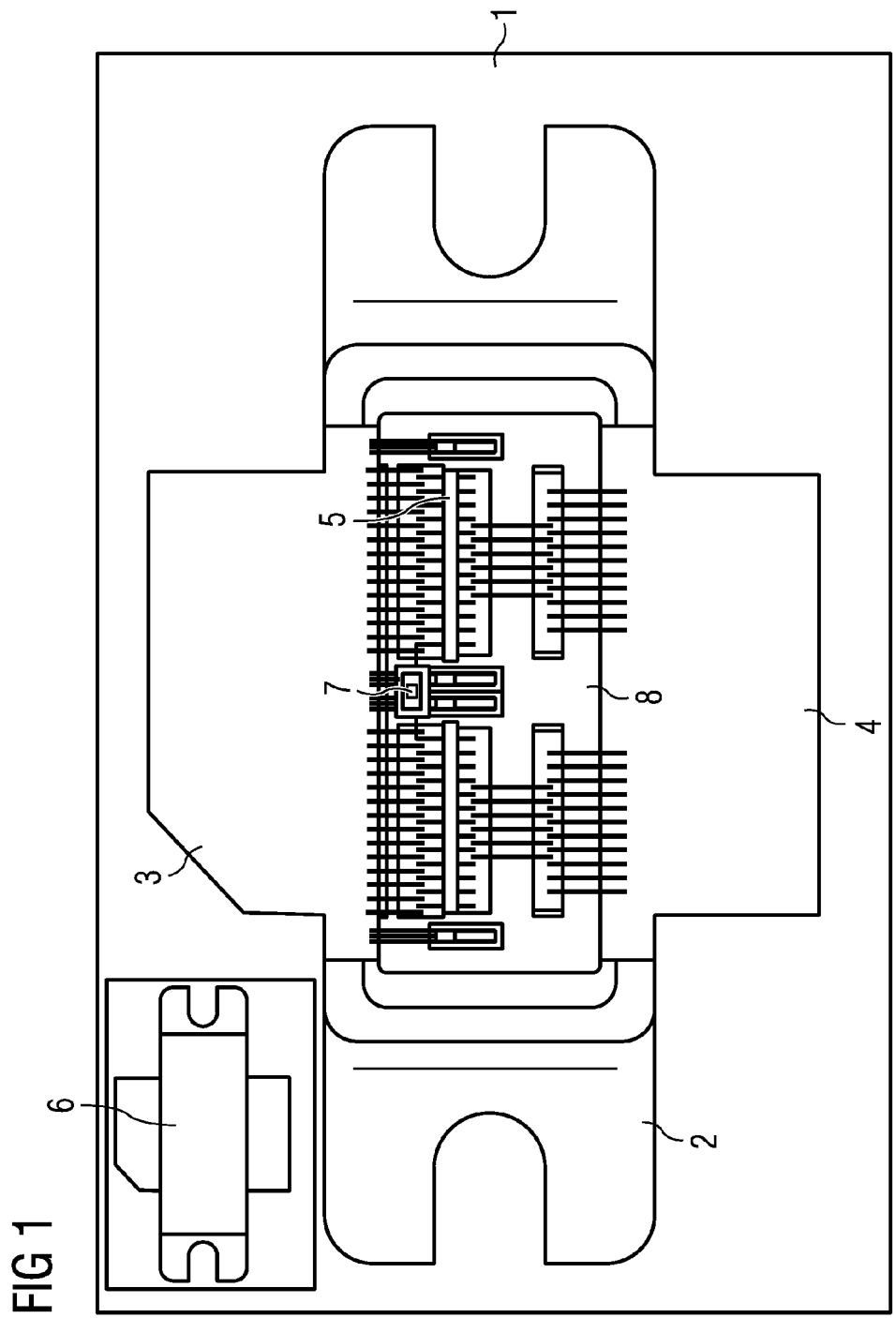
FIG. 1 illustrates a prior art package of an LDMOS transistor.
Figure 2A:
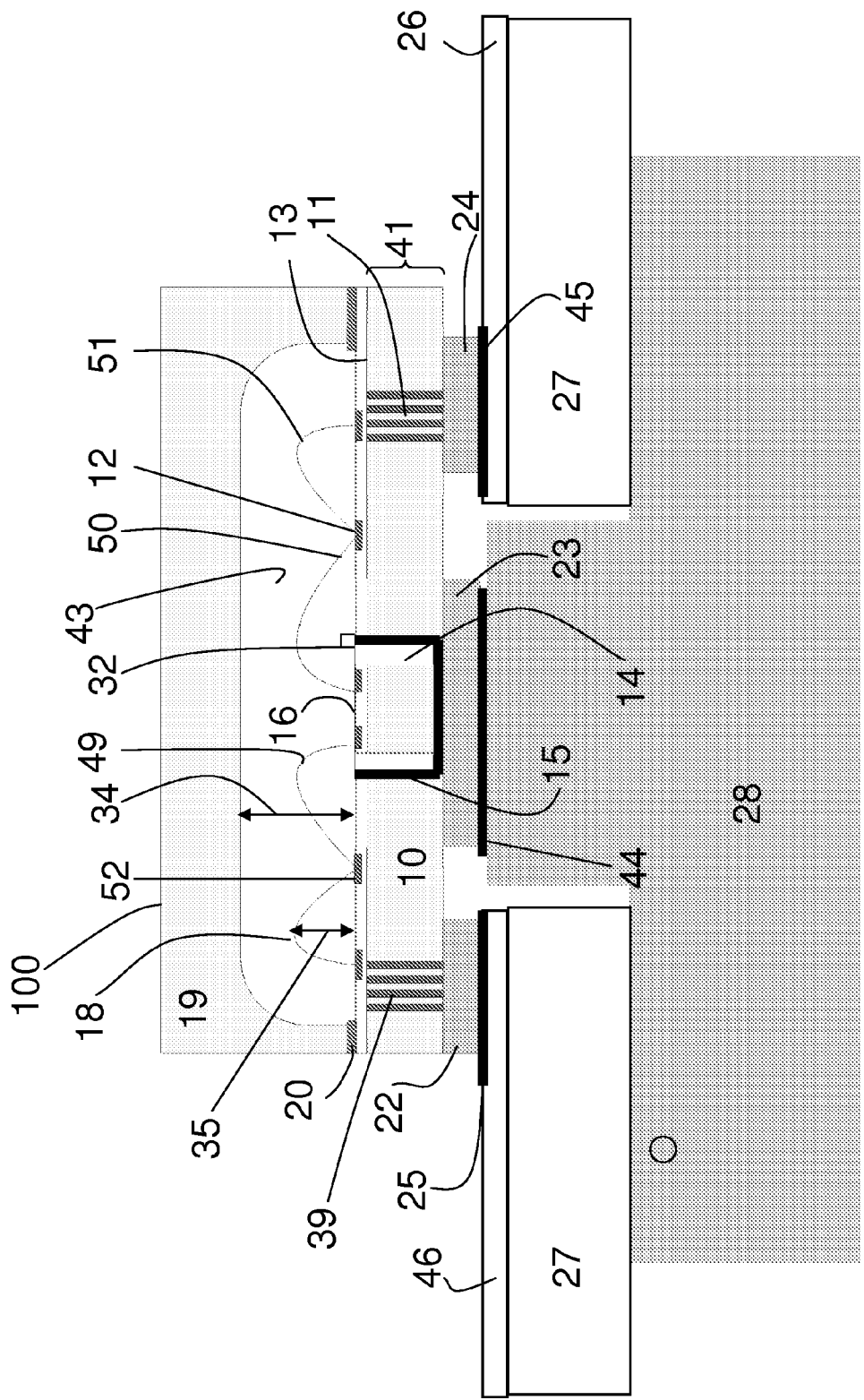
FIGS. 2a and 2b illustrate an IC package in accordance with an embodiment of the invention.
Figure 2B:
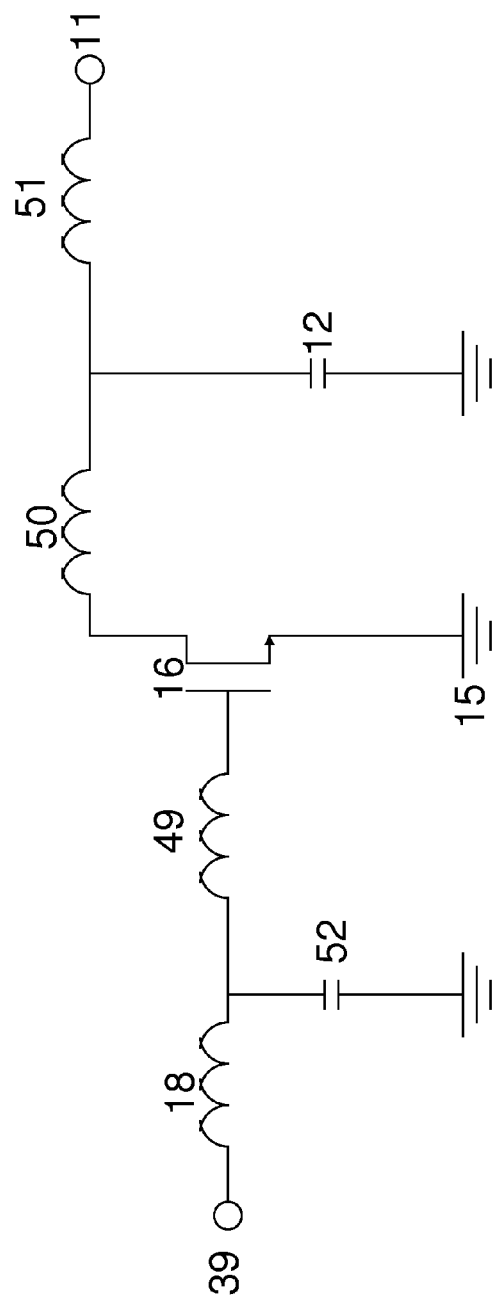

An embodiment of wafer level package 100 is illustrated in FIGS. 2a and 2b. FIG. 2a illustrates a cross section illustrating the physical arrangement of elements, while FIG. 2b illustrates a schematic of the circuit.

In FIG. 2a, semiconductor substrate 10 contains cavity 14 disposed within substrate 10. In some embodiments, passive and/or active devices are disposed on substrate 10. Substrate 10 contains recess 14, which is lined with conductive material 15. Integrated circuit 16, such as a power transistor die, is placed on conductive material 15 inside recess 14. Bond wires 18 connect integrated circuits 16 to capacitors 12 and 52. Bond wires 18, 49, 50 and 51 also connect capacitors 12 and 52 to conductive materials 11 and 39. In one embodiment, capacitors 12 and 52 are disposed on substrate 10. Alternatively, other passive components, such as resistors and inductors may also be disposed on substrate 10. Cap 19 is attached to substrate 10 to enclose integrated circuit 16 and bond wires 18. Integrated circuit 16 is finally coupled to external heat sink 28. In some embodiments, passive devices, such as capacitor 12, and bond wires 18, form a matching network.

Substrate 10 contains a layer of nonconductive material 13. Disposed in nonconductive material 13 are capacitors 12 and

52. In one embodiment, capacitors 12 and 52 are Metal-Insulator-Metal (MIM) capacitors.

Conductive material 15 lines at least the bottom of cavity 14. In one embodiment, conductive material 15 lines the entire inner surface of cavity 14. Alternately, only the bottom part of cavity 14 is lined with conductive material 15. The bottom of conductive material 15 extends to the bottom of substrate 10. Integrated circuit 16 is disposed on conductive material 15. In one embodiment, integrated circuit 16 is and LDMOS power transistor. In other embodiments, integrated circuit 16 is another type of radio frequency (RF) transistor.

Substrate 10 contains through silicon vias (TSV) 11 and 39 for interfacing with external circuits. Bond wire 18 couples IC 16 and capacitor 52. Bond wire 50 couples IC 16 and capacitor 12. Bond wire 51 couples capacitor 12 to output TSV 11. Bond wire 49 couples capacitor 12 to input TSV 39.

Cap 19 contains cavity 43. Cap 19 is disposed on the top surface of substrate 10 such that cavity 43 overlies cavity 14. Metallic interconnect 20 connects cap 19 to substrate 10. Ground contact 23 is coupled to conductive material 15. Input contact 22 is coupled to input TSV 39. Output contact 24 is coupled to output TSV 11. Conductive material 25 is coupled to input contact 22. Conductive material 44 is coupled to ground contact 23. Conductive material 45 is coupled to output contact 24.

Conductive materials 44, 25, 45 and 46 are coupled to external heat sink 28, conductive material 46, conductive material 26, and printed circuit board (PCB) 27, respectively. PCB 27 contains a hole that allows ground contact 23, and therefore IC 16, to be coupled to external heat sink 28 thermally and electrically. Conductive material 26 is disposed on printed circuit board 27. Printed circuit board 27 is disposed on external heat sink 28.

FIG. 2b illustrates a schematic representation of the circuit for the embodiment illustrated in FIG. 2a. Input (conductive material) 39 is connected it inductor (bond wire) 18. Inductor 18 is connected to capacitor 15, which is grounded, and to inductor (bond wire) 49. Inductor 49 is connected to the gate of transistor (IC) 16. The source of transistor 16 is connected to ground (conductive material) 15. The drain of transistor 16 is connected to inductor (bond wire) 50. Inductor 50 is connected to capacitor 12, which is grounded, and to inductor (bond wire) 51. Inductor 51 is connected to output (conductive material) 11.

Figure 3A:
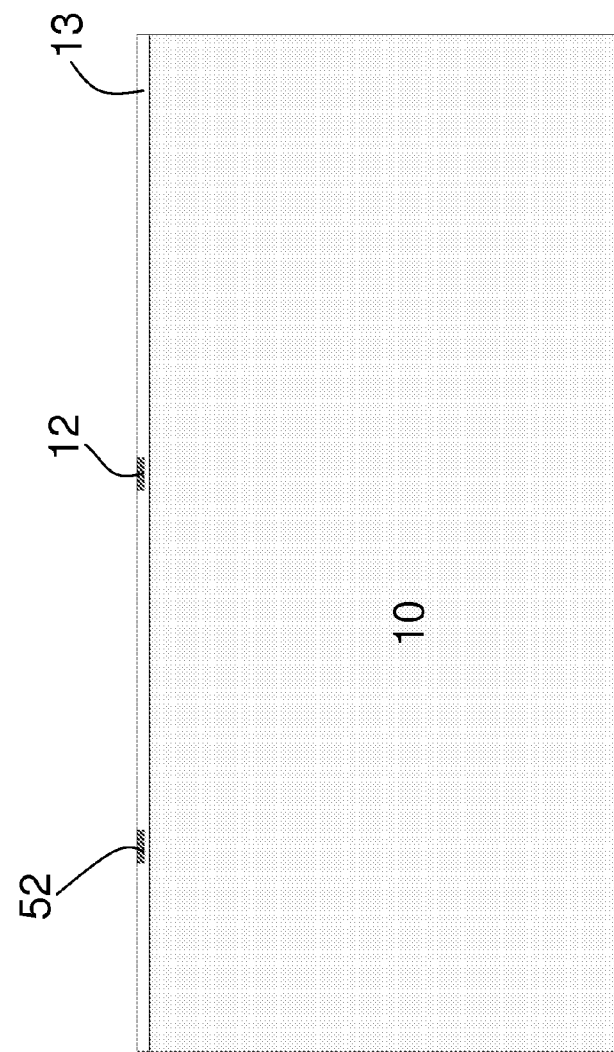
FIGS. 3a-k illustrate a method of packaging an IC in accordance with an embodiment of the invention.

FIGS. 3a-3l, illustrate cross sections representing an embodiment of wafer level packaging. FIG. 3a illustrates substrate 10, which is provided. In some embodiments, substrate 10 is a silion high ohmic substrate. In other embodiments, substrate 10 may be another type of semiconductor material, such as low ohmic substrate, SiC or glass wafer. In some embodiments, substrate 10 contains nonconductive material 13 at the top surface of substrate 10. Nonconductive material may be, for example, CVD Oxide, TEOS, thermal Oxide, Bor Phosphorous Silicate glass, Silicon Nitride, Silicon Oxi-Nitride, and/or Polyimide. In some embodiments, passive elements are fabricated on substrate 10 using techniques known in the art. The passive elements can include capacitors 12 and 52 and resistors. In further embodiments, active devices can also be fabricated on substrate 10. In some embodiments, the capacitors can be Metal-Oxide-Metal (MIM) capacitors, poly-poly capacitors, sandwich capacitors, metal oxide semiconductor (MOS) capacitors, or other capacitor types. Resistors can include, for example polysilicon resistors or metal line resistors.

Figure 3B:
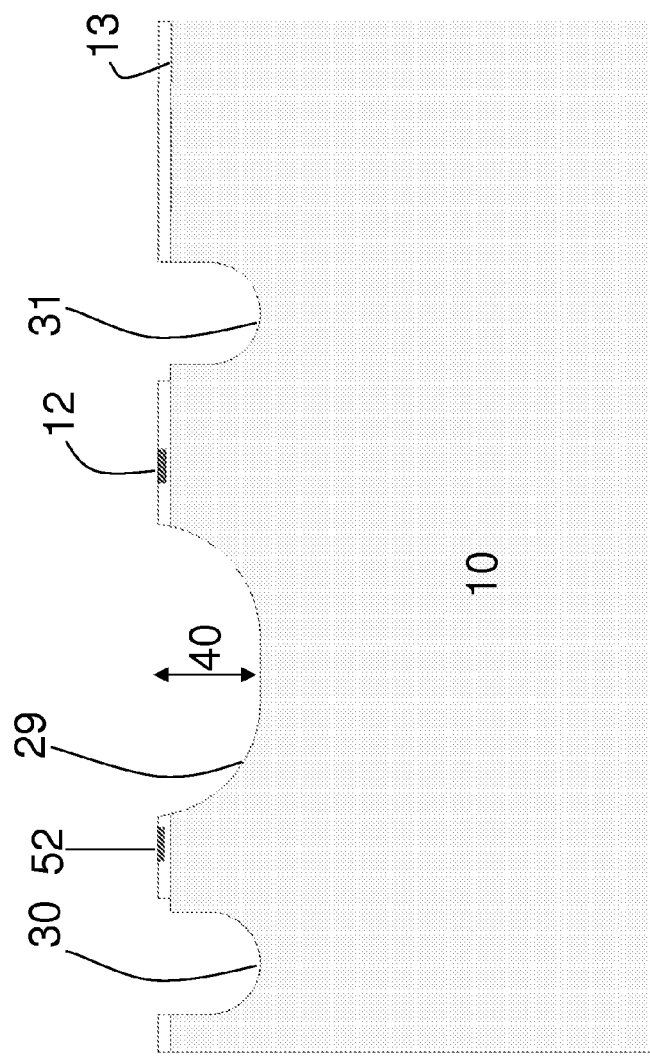

As shown in FIG. 3b, recesses 29, 30 and 31 are etched in substrate 10. In some embodiments, recesses 29, 30 and 31 are etched using an isotropic etch, such as reactive ion etching (RIE), plasma etching, vapor phase etching, or wet etching. In other embodiments, recesses 29, 30 and 31 are etched using an anisotropic etch. Embodiment anisotropic etching processes include sputter etching, RIE etching, plasma etching or wet etching. Recesses 29, 30 and 31 have a height 40. In some embodiments, height 40 is between about 50 microns to about 100 microns.

Figure 3C:
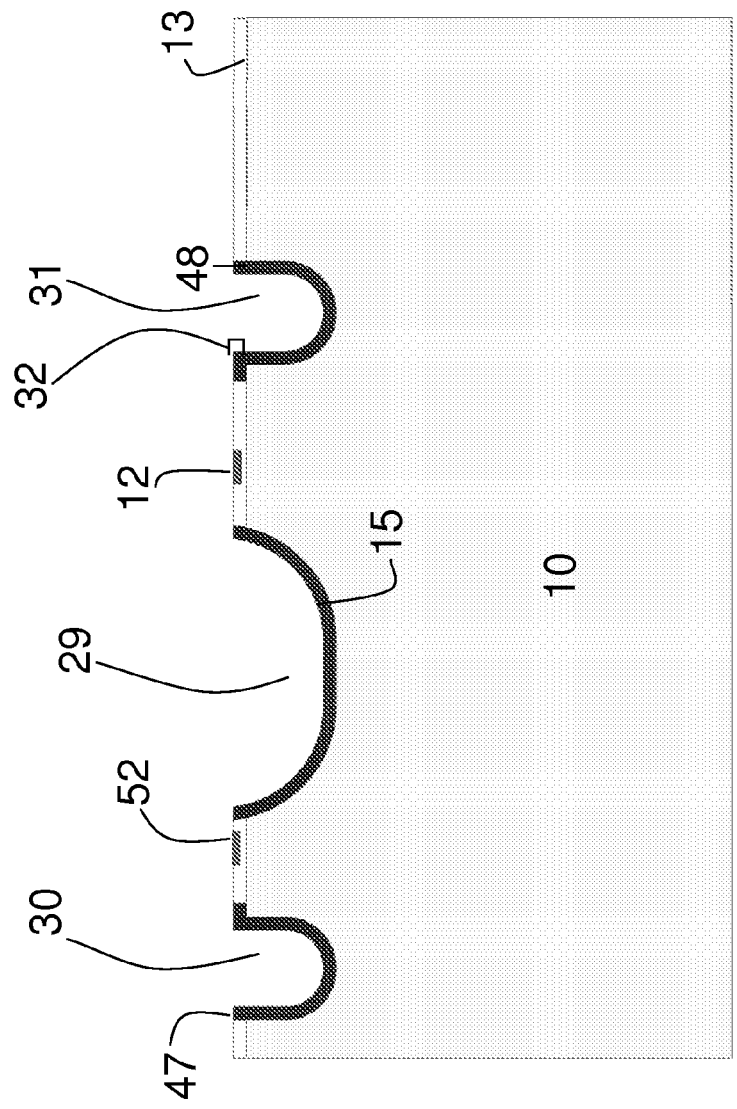

As shown in FIG. 3c, conductive material 15, 47 and 48 is deposited in at least the bottom portions of recesses 29, 30 and 31. In some embodiments, the deposition is performed by a copper galvanic process, sputtering, or another process. Conductive material 15, 47 and 48 has thickness 32 of between about 10 microns and about 40 microns. In some embodiments, conductive material 15, 47 and 48 is copper, aluminum, gold or another conductive material.

Figure 3D:
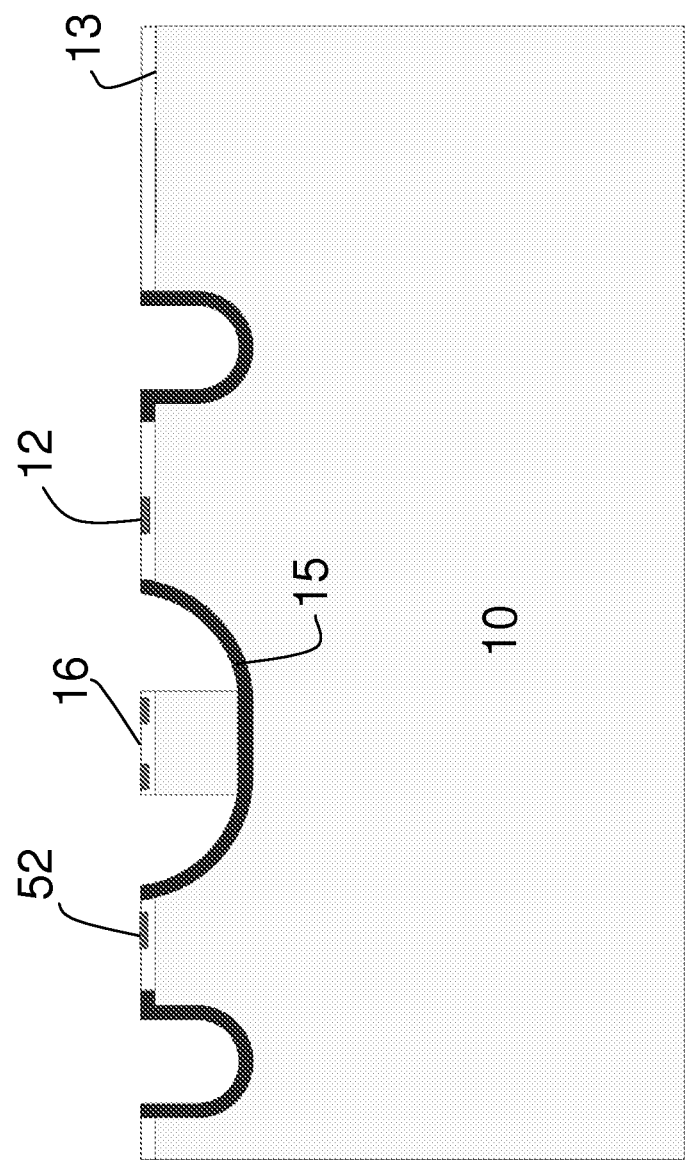

As shown in FIG. 3d, IC 16 is attached to conductive material 15. In some embodiments, the attaching is performed by diffusion soldering, eutectic bonding, galvanic connection, metallically conductive paste, gluing, or other methods of attaching.

Figure 3E:
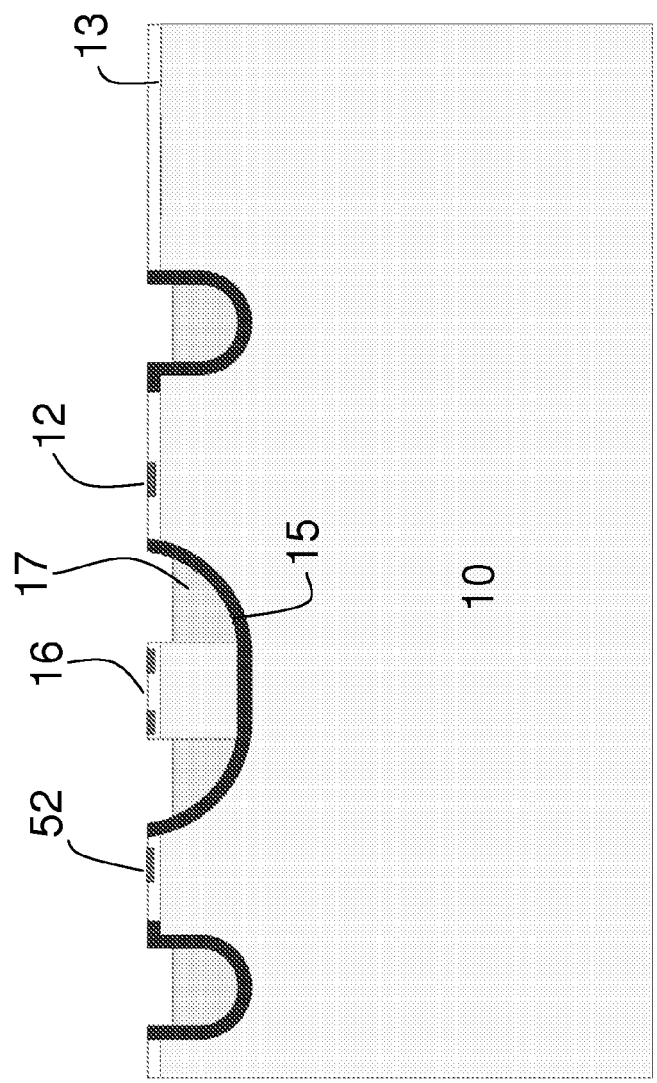

FIG. 3e shows the optional step of at least partially filling recesses 29, 30 and 31 with embedding material 17. In some embodiments, the embedding process includes performing a thermoplastic process, refilling with a non-conductive paste, or using other methods of filling with embedding. In some embodiments, the embedding material is underfiller, globe top, epoxy, silicone, imide or thermoplast.

Figure 3F:
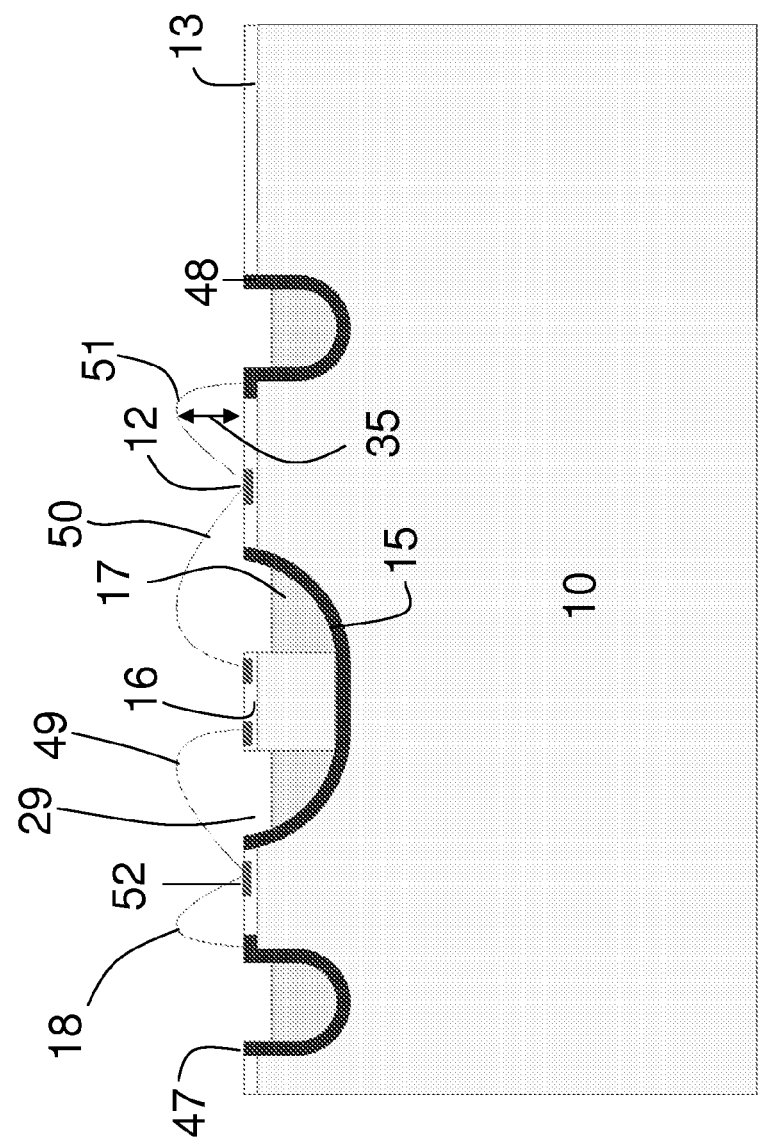

As shown in FIG. 3f, bond wires are attached. Bond wire 49 is attached to IC 16 and to capacitor 52, bond wire 18 is attached to capacitor 52 and to conductive material 47, bond wire 50 is attached to IC 16 and to capacitor 12, and bond wire 51 is attached to capacitor 12 and conductive material 48. Bond wires 18, 49, 50 and 51 have a height 35. In some embodiments, height 35 is between about 100 microns to about 200 microns. Alternately, other heights can be used. The inductances of bond wires 18, 49, 50 and 51 are tuned to impedance match the input and output to optimize performance.

Figure 3G:
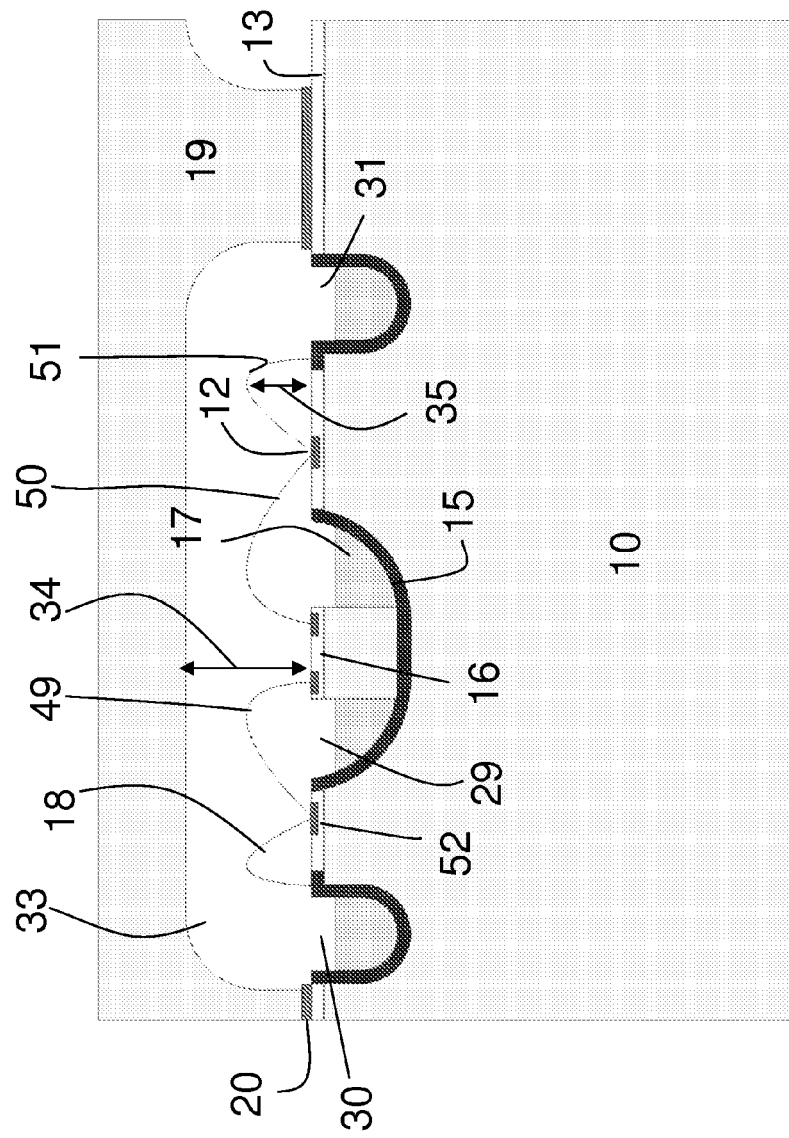

As shown in FIG. 3g, cap 19 containing recess 33 is bonded to substrate 10 using connecting material 20. Recess 33 is etched in cap 19. In some embodiments, recess 33 is formed by isotropic etching. In other embodiments, recess 33 is formed by anisotropic etching. In some embodiments, the bonding is performed by wafer bonding, diffusion bonding, or another bonding method. The bonding is performed at the wafer level. In some embodiments, cap 19 is thermally matched to substrate 10. In some embodiments, cap 19 is the same material as substrate 10. In some embodiments, cap 19 is a low ohmic material. In some embodiments, cap 19 is silicon, glass, silicon coated with a conductive material, metal, or another material. Alternatively, single metal lids may be used. Recess 33 is placed over IC 16 and bond wires 18, 49, 50 and 51. In some embodiments, the height 34 of recess 19 is about twice the height 35 of bond wires 18, 49, 50, and 51. In some embodiments, height 34 is between about 200 microns to about 400 microns. In some embodiments, connecting material 20 is floating. In other embodiments, connecting material 20 is grounded. In some embodiments, connecting material 20 is a nonconductive material such as epoxy or silicone glue. In other embodiments, connecting material 20 is a conductive material such as solder or conductive glue.

Figure 3H:
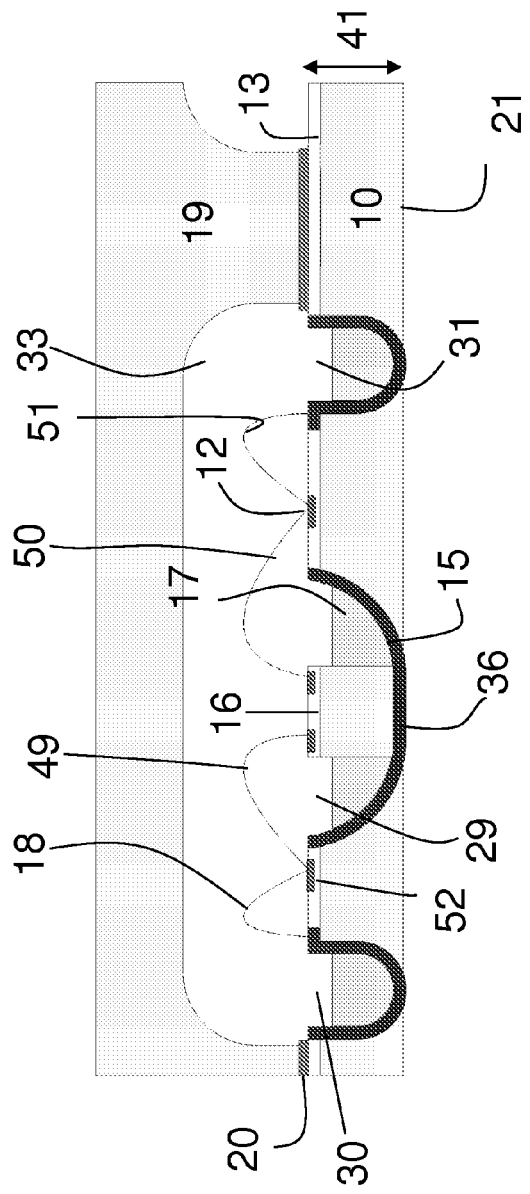

As shown in FIG. 3h, substrate 10 is ground or thinned such that bottom 36 conductive material 15 is exposed at the bottom 21 of substrate 10. In some embodiments, the grinding is performed by chemical mechanical polishing (CMP). After grinding, substrate 10 has a thickness 41. In some embodiments, thickness 41 is between about 100 microns to about 400 microns. However, other thicknesses can be used in alternative embodiments.

Figure 3I:
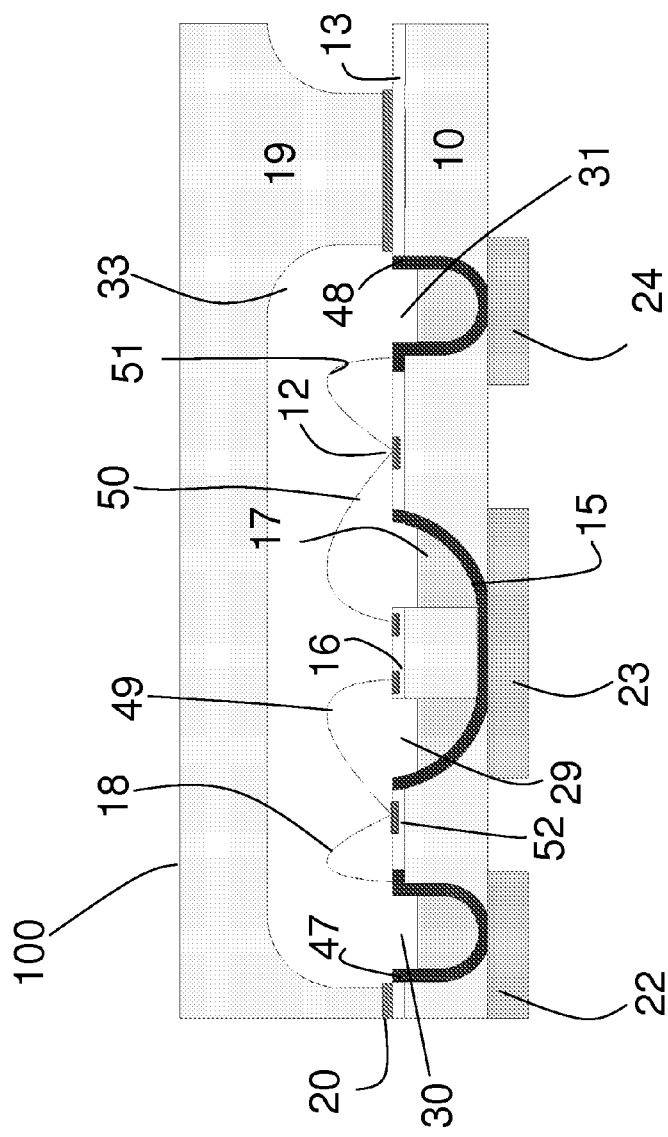

As shown in FIG. 3i, conductive pad 23 is attached to conductive material 15, conductive pad 22 is attached to conductive material 47, and conductive pad 24 is attached to conductive material 48. In some embodiments, the attaching is performed by printing solder paste, by sputtering, or by another method. In some embodiments, conductive pads 22, 23 and 24 are made of gold, tin, copper, tin, or multi metal stacks, such as NiP/Pd/Au, ENIG (electroless deposited galvanic Ni Au). In further embodiments or another conductive material may be used.

Figure 3J:
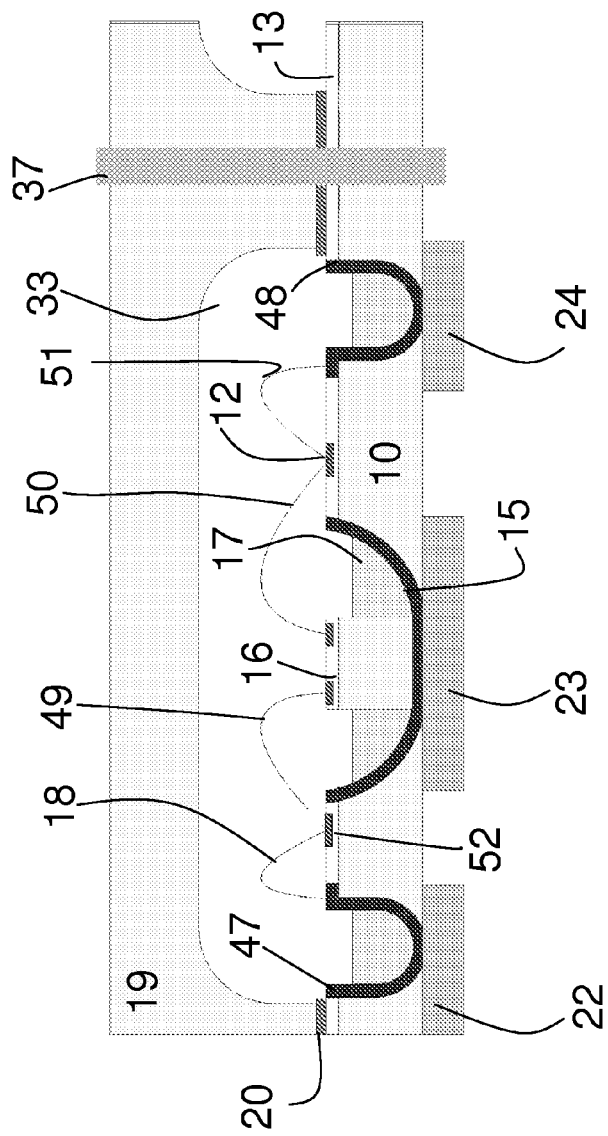

As shown in FIG. 3j the wafer is diced at scribe line 37. In an embodiment, dicing is performed using techniques known in the art, for example sawing. A final test is performed.

Figure 3K:
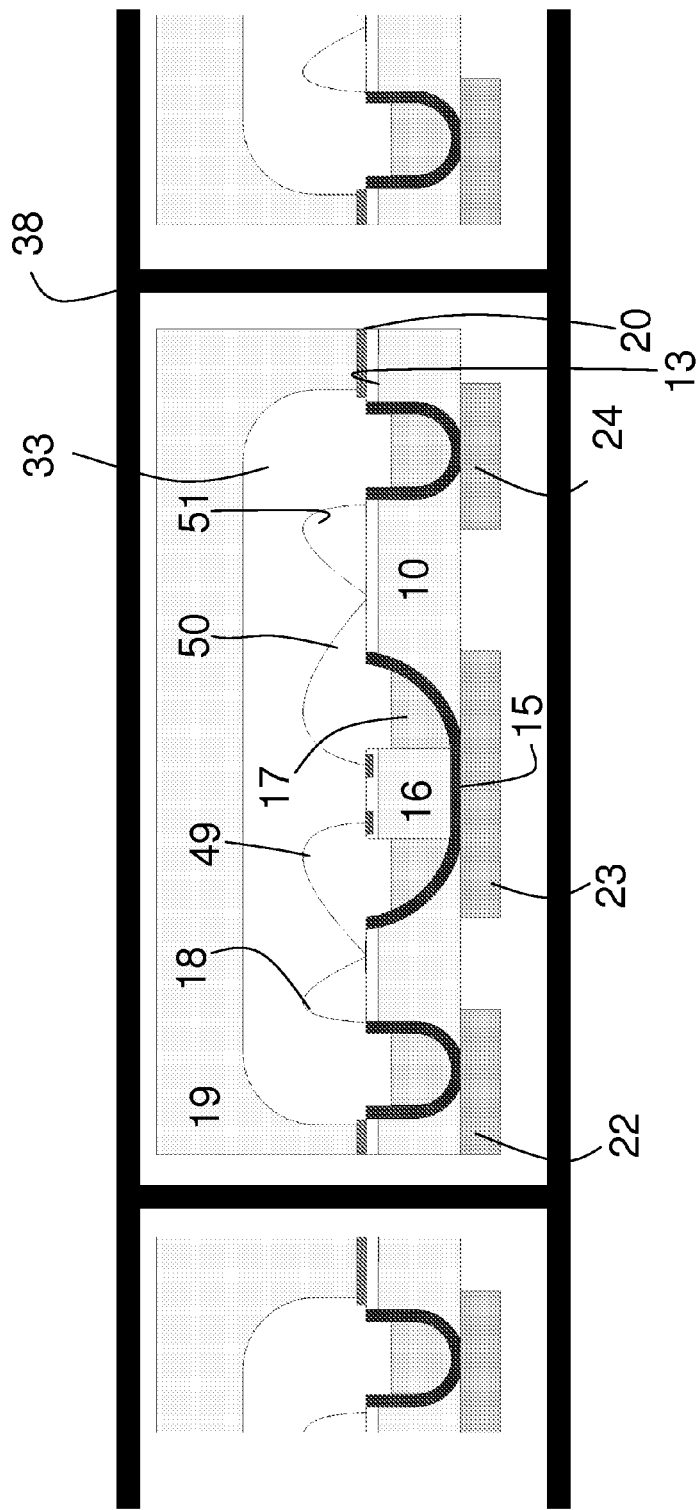

As shown in FIG. 3k, the diced wafer is placed on tape and reel 38 for distribution to the final customer.

Figure 4A:
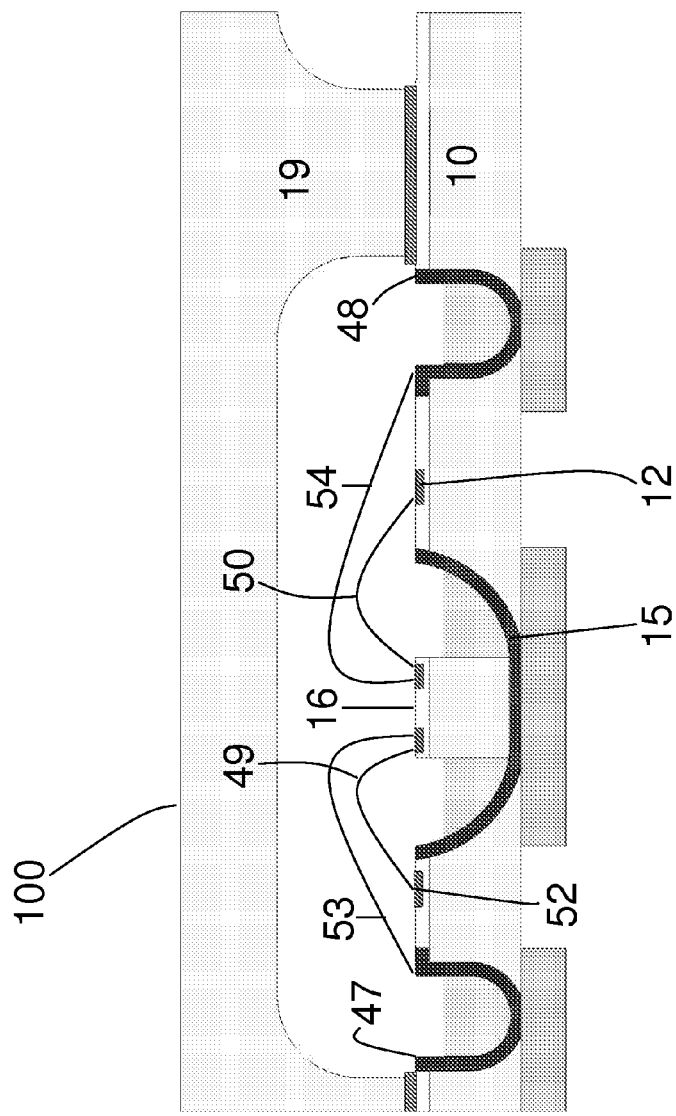
FIGS. 4a-b illustrate an IC package in accordance with an embodiment of the invention.
Figure 4B:
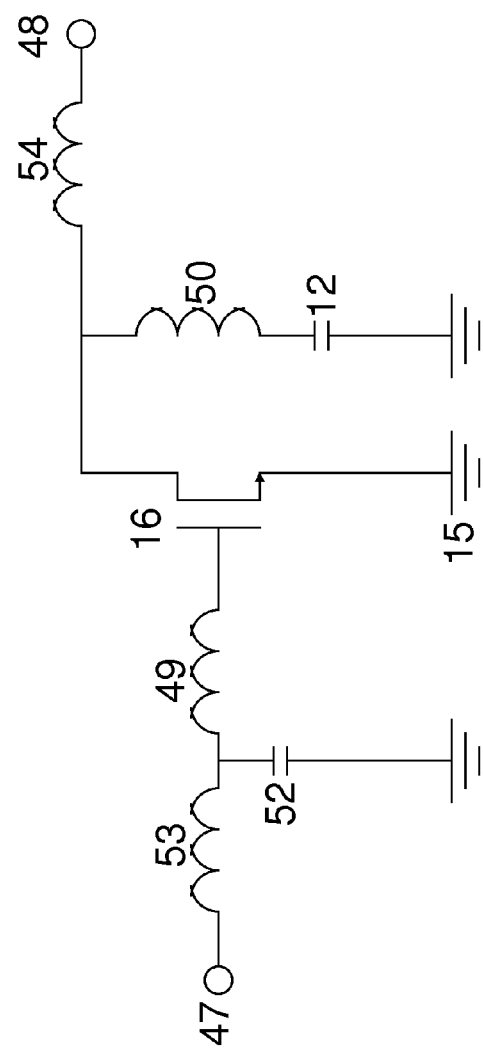

FIGS. 4a and 4b show an alternate embodiment for a matching circuit. FIG. 4a shows a cross section illustrating the physical arrangement of elements, while FIG. 4b shows a circuit diagram of the matching circuit. Input (conductive material) 47 is connected to inductor (bond wire) 53. Inductor 53 is connected to capacitor 52, which is grounded. Inductor 53 is also connected to inductor (bond wire) 49, which is connected to the gate of transistor (IC) 16. The source of transistor 16 is connected to ground (conductive material) 15. The drain of transistor 16 is connected to inductor (bond wire) 50 and to inductor (bond wire) 54. Inductor 50 is connected to capacitor 12, which is grounded. Inductor 54 is connected to output (conductive material) 48.

Figure 5:
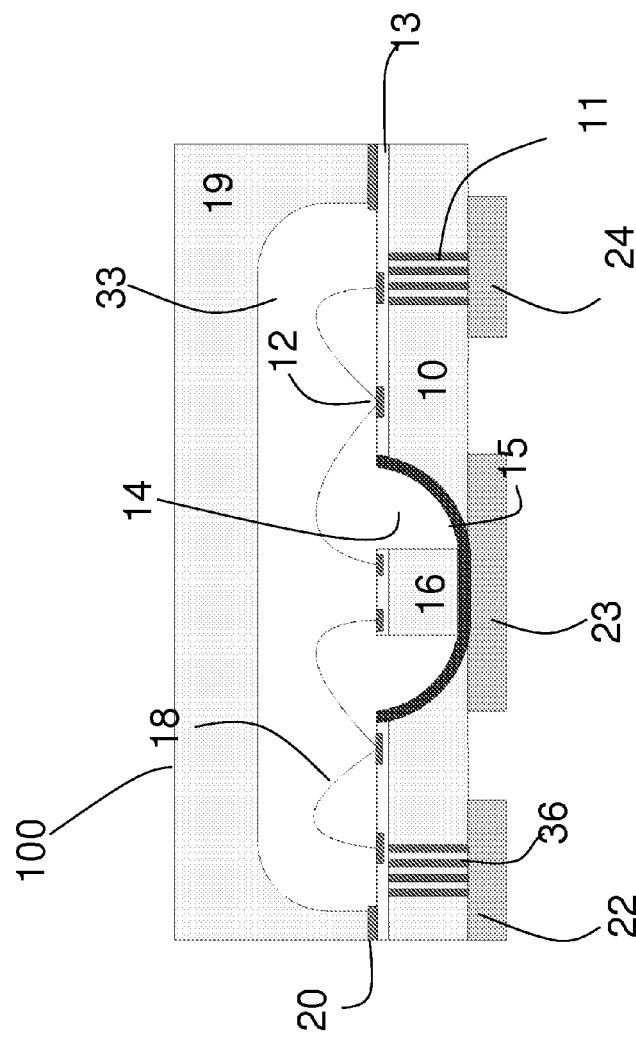
FIG. 5 illustrates an IC package in accordance with another embodiment of the invention.

An alternative embodiment of wafer level package 100 is illustrated in FIG. 5. The embodiment illustrated in FIG. 5 is similar to the embodiment illustrated in FIG. 3i except for the following differences. The embodiment illustrated in FIG. 5 does not have embedding material in recess 14. Recess 30, with embedding material 17 and conductive material 47, in the embodiment illustrated in FIG. 3i, is replaced with TSV 36 in the embodiment illustrated in FIG. 5. Similarly, recess 31, with embedding material 17 and conductive material 48, in the embodiment illustrated in FIG. 3i, is replaced with TSV 11 in FIG. 5.

Figure 6:
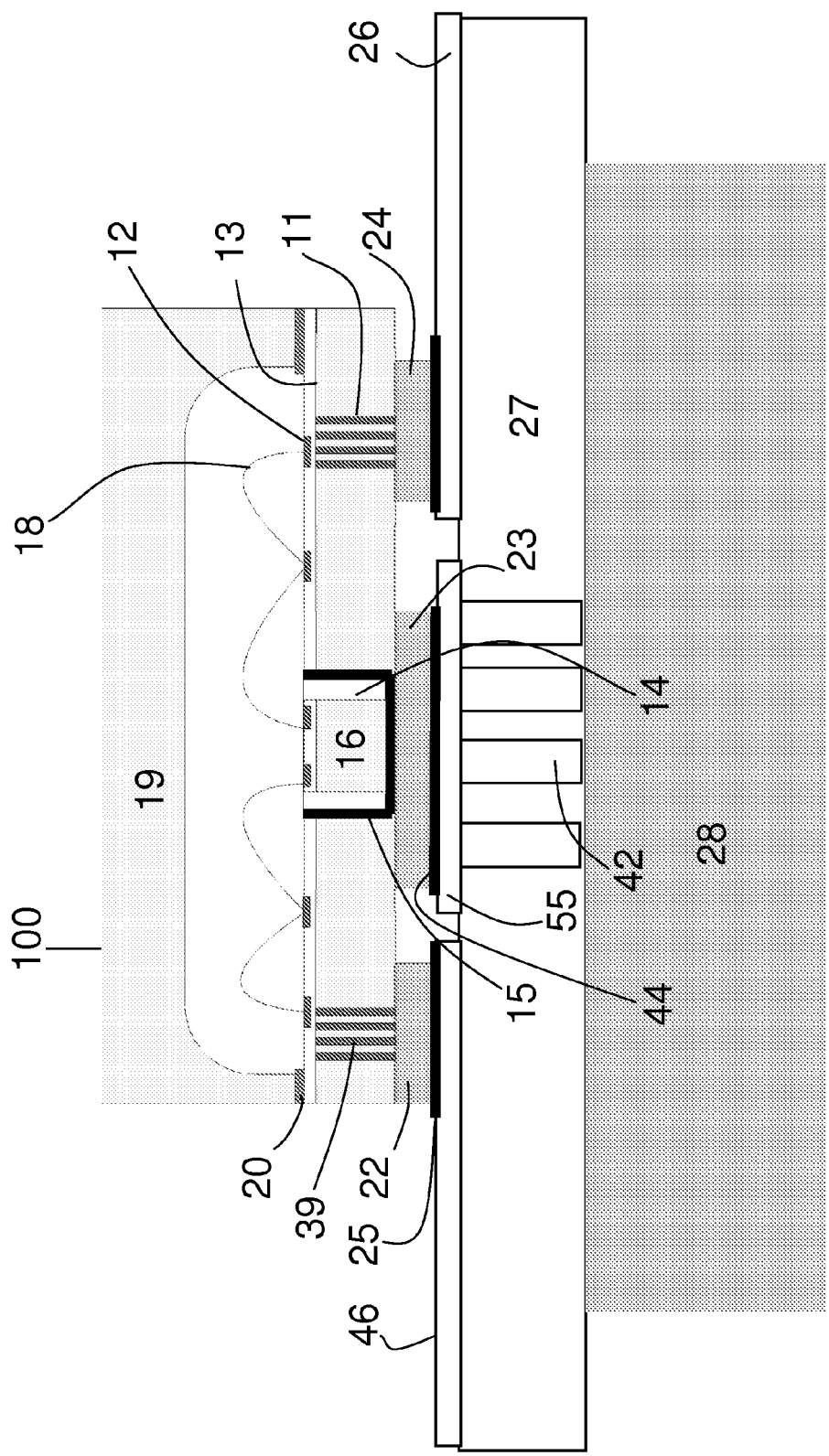
FIG. 6 illustrates an IC package in accordance with a further embodiment of the invention.

A further alternative embodiment of wafer level package 100 is illustrated in FIG. 6. The embodiment illustrated in FIG. 6 is similar to the embodiment illustrated in FIG. 2a except for the following differences. Instead, the coupling of conductive material 15 and IC 16 with external heat sink 28 is performed by ground contact 23 contacting conductive material 44, which contacts PCB 27. PCB 27 contains vias 42, which contact both conductive material 44 and external heat sink 28, providing a thermal and electrical coupling. Here, external heat sink is thermally coupled to IC 16 via conductive material 16, contacting conductive material 44, conductive material 55, ground contact 23 and vias within PCB 27.

Figure 7:
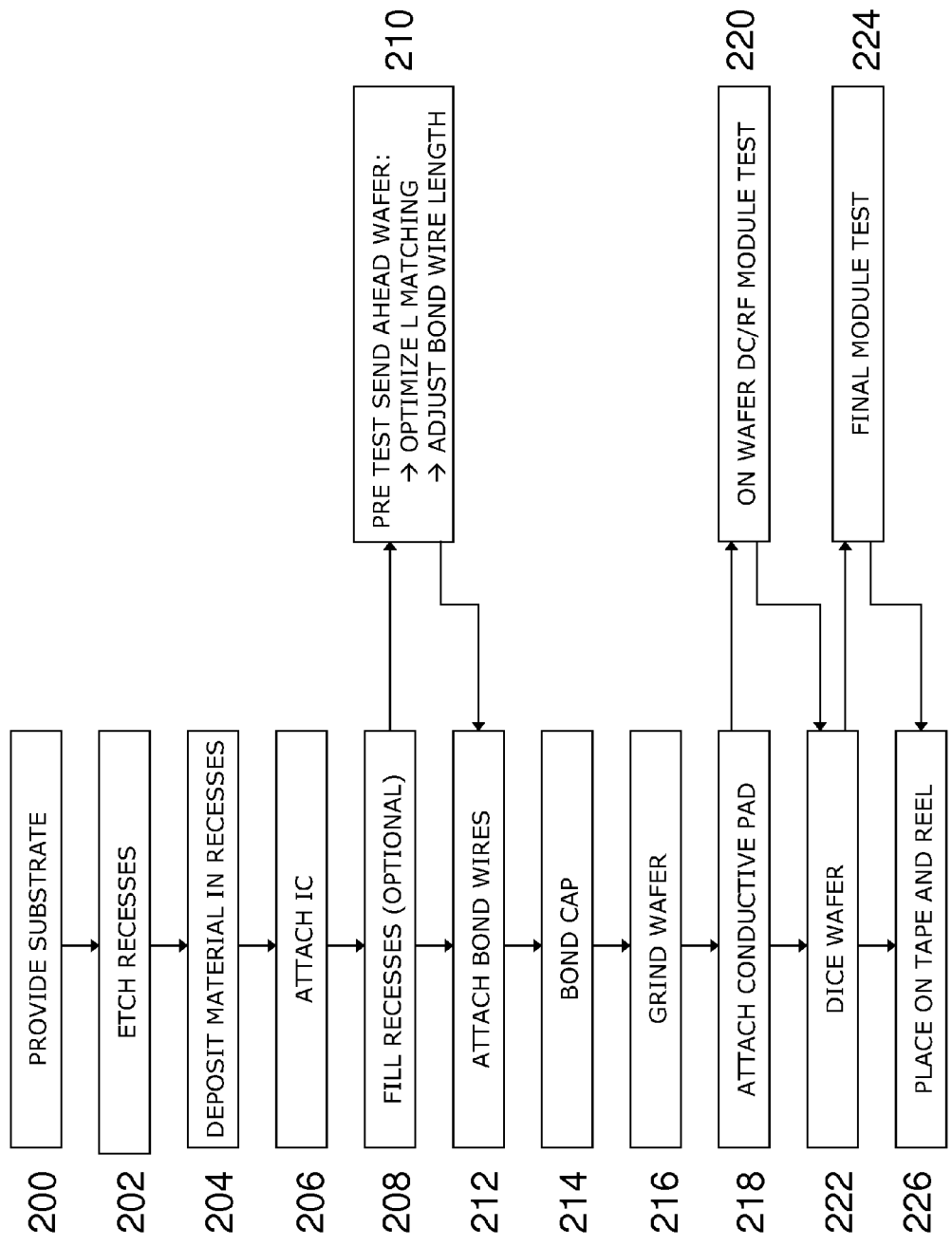
FIG. 7 illustrates a method of packaging an IC in accordance with an embodiment of the invention.

FIG. 7 shows an embodiment of a method of packaging an IC. Step 200 involves providing a substrate that contains passive elements. Next, step 202 is etching recesses in the substrate, followed by step 204, depositing conductive material in at least the bottom of the recesses. Step 206 is attaching an IC to the conductive material in a recess. Step 208, an optional step, involves at least partially filling the recesses with embedding material. After step 208, testing step 210 is performed. Testing step 210 involves testing a send ahead wafer to optimize impedance matching by adjusting the inductance of bond wires by adjusting the length of the bond wires. After testing step 210, bond wires are attached in step 212. Next, a cap is bonded to the substrate in step 214, and the bottom of the wafer is ground in step 216, such that the bottom of the conductive material is exposed at the bottom of the wafer. In step 218, conductive pads are attached to the bottom of the conductive material at the bottom of the wafer. After step 218, on wafer DC and RF module testing is performed in testing step 220. The wafer is diced in step 222, and final module testing is performed in testing step 224. Finally, in step 226, the diced wafer pieces are placed on a tape and reel for distribution.

Advantages of embodiments include a low cost of packaging. Because the packaging is performed at the wafer level, many ICs can be packaged simultaneously at a low cost. Bond wire lengths can be tuned to create a matching circuit for multiple ICs at the same time, further contributing to a low cost. Advantages of embodiments also include that the bond wires are surrounded by air, which reduces coupling. Shorter bond wire lengths reduce packaging parasitic coupling. The structure of an IC in a cavity provides good thermal coupling to the heat sink.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   a semiconductor substrate;
   a first cavity disposed through the semiconductor substrate;
   a conductive material covering at least a bottom portion of the first cavity;
   an integrated circuit disposed on a top surface of the conductive material opposite the bottom portion of the first cavity; and
   a cap comprising a second cavity disposed on a first surface of the cap, wherein the first surface of the cap is disposed on a top surface of the substrate such that the second cavity overlies the first cavity.

2. The semiconductor device of claim 1 further comprising:
   a conductive pad disposed on a bottom surface of the semiconductor substrate, the conductive pad electrically contacting a bottom surface of the conductive material.

3. The semiconductor device of claim 1, wherein the semiconductor substrate comprises silicon or silicon carbide.

4. The semiconductor device of claim 1, wherein the conductive material has a thickness of at least 1 micron.

5. The semiconductor device of claim 1 further comprising an embedding material at least partially filling the first cavity.

6. The semiconductor device of claim 1, wherein the semiconductor substrate has a thickness of between about 50 microns and about 400 microns.

7. The semiconductor device of claim 1, wherein the cap is thermally matched to the semiconductor substrate.

8. The semiconductor device of claim 2, further comprising:
   a heat sink thermally connected to the conductive pad; and
   a printed circuit board containing vias, the vias thermally connected to the heat sink, the vias thermally connected to the conductive pad.

9. The semiconductor device of claim 5, wherein the embedding material comprises thermoplastic.

10. The semiconductor device of claim 7, wherein the cap and the semiconductor substrate comprise a same material.

11. A semiconductor device comprising:
a semiconductor substrate;
a first cavity disposed through the semiconductor substrate;
a first conductive material covering at least a bottom portion of the first cavity;
a transistor die disposed on a top surface of the first conductive material;
a first bond wire coupled to the transistor die;
a first capacitor coupled to the first bond wire;
a second bond wire coupled to the transistor die;
a second capacitor coupled to the second bond wire; and
a cap comprising a second cavity disposed on a first surface of the cap, wherein the first surface of the cap is disposed on a top surface of the substrate such that the second cavity overlies the first cavity.

12. The semiconductor device of claim 11, further comprising:
a third cavity disposed through the semiconductor substrate;
a second conductive material covering at least a bottom portion of the third cavity;
a fourth cavity disposed through the semiconductor substrate; and
a third conductive material covering at least a bottom portion of the fourth cavity.

13. The semiconductor device of claim 11, further comprising:
a first through-silicon via disposed in the semiconductor substrate, the first through-silicon via coupled to the first capacitor; and
a second through-silicon via disposed in the semiconductor substrate, the second through-silicon via coupled to the second capacitor.

14. The semiconductor device of claim 11 further comprising a first embedding material at least partially filling the first cavity.

15. The semiconductor device of claim 11, wherein the transistor die comprises a LDMOS transistor.

16. The semiconductor device of claim 12, wherein the first conductive material, the second conductive material, and the third conductive material comprise a same material.

17. The semiconductor device of claim 12 further comprising:
a first embedding material at least partially filling the first cavity;
a second embedding material at least partially filling the third cavity; and
a third embedding material at least partially filling the fourth cavity.

18. The semiconductor device of claim 12, further comprising:
a third bond wire coupled between the first capacitor and the second conductive material; and
a fourth bond wire coupled between the second capacitor and the third conductive material.

19. The semiconductor device of claim 12, further comprising:
a first conductive pad disposed on a bottom surface of the semiconductor substrate, the first conductive pad coupled to a bottom surface of the first conductive material;
a second conductive pad disposed on a bottom surface of the semiconductor substrate, the second conductive pad coupled to a bottom surface of the second conductive material; and
a third conductive pad disposed on a bottom surface of the semiconductor substrate, the third conductive pad coupled to a bottom surface of the third conductive material.

20. A method of manufacturing a semiconductor device, the method comprising:
providing a substrate;
etching a first recess in a top surface of the substrate;
coating the first recess with a first conductive material;
attaching an integrated circuit to the first conductive material;
attaching a cap to the top surface of the substrate; and
grinding the substrate, wherein a bottom surface of the conductive material is exposed.

21. The method of claim 20, wherein the coating the first recess comprises sputtering the first conductive material in the first recess.

22. The method of claim 20, further comprising:
filling the recess with an embedding material.

23. The method of claim 20, wherein:
the substrate comprises a first component; and
the method further comprises
attaching a first bond wire to the integrated circuit, and
attaching the first bond wire between the integrated circuit and the first component.

24. The method of claim 20, wherein the integrated circuit comprises an LDMOS power transistor.

25. The method of claim 20, wherein the attaching the cap comprises diffusion bonding.

26. The method of claim 20, further comprising:
attaching a conductive pad to the first conductive material.

27. The method of claim 20, wherein the substrate comprises a semiconductor wafer, the method further comprising dicing the semiconductor wafer.

28. The method of claim 20 further comprising:
etching the substrate; and
coating the etched substrate with a second conductive material, forming through-silicon vias.

29. The method of claim 20 further comprising:
etching a second recess in a top surface of the substrate;
coating the second recess with a second conductive material;
etching a third recess in a top surface of the substrate; and
coating the first third with a third conductive material.

30. The method of claim 23, wherein the first component comprises a capacitor.

31. The method of claim 26, wherein the attaching the conductive pad comprises sputtering.

* * * * *